United States Patent
Chen et al.

(10) Patent No.: US 9,836,106 B2
(45) Date of Patent: Dec. 5, 2017

(54) METHOD AND APPARATUS FOR POWERING ON A TERMINAL

(71) Applicant: HUAWEI DEVICE (DONGGUAN) CO., LTD., Dongguan (CN)

(72) Inventors: Jiang Chen, Shanghai (CN); Huai Su, Shanghai (CN); Lei Zeng, Shenzhen (CN)

(73) Assignee: HUAWEI DEVICE (DONGGUAN) CO., LTD., Dongguan (CN)

( * ) Notice: Subject to any disclaimer, the term of this patent is extended or adjusted under 35 U.S.C. 154(b) by 0 days.

(21) Appl. No.: 14/901,825

(22) PCT Filed: Jul. 14, 2014

(86) PCT No.: PCT/CN2014/082145
§ 371 (c)(1),
(2) Date: Dec. 29, 2015

(87) PCT Pub. No.: WO2015/070629
PCT Pub. Date: May 21, 2015

(65) Prior Publication Data
US 2016/0161999 A1    Jun. 9, 2016

(30) Foreign Application Priority Data
Nov. 13, 2013 (CN) .......................... 2013 1 0565859

(51) Int. Cl.
*G06F 1/26* (2006.01)
*G06F 1/16* (2006.01)
*H03K 17/96* (2006.01)

(52) U.S. Cl.
CPC .............. *G06F 1/26* (2013.01); *G06F 1/1656* (2013.01); *H03K 17/964* (2013.01)

(58) Field of Classification Search
CPC .................................. G06F 1/26; G06F 1/1656
See application file for complete search history.

(56) References Cited

U.S. PATENT DOCUMENTS 6,453,169 B1 * 9/2002 Maloney ............. H04M 1/7258
455/567
8,385,885 B2 * 2/2013 Hainzl ...................... G06F 1/32
345/173
(Continued)

FOREIGN PATENT DOCUMENTS

CN          1690959 A     11/2005
CN         11690959 A     11/2005
(Continued)

OTHER PUBLICATIONS

Partial English Translation and Abstract of Chinese Patent Application No. CN1690959, Dec. 26, 2015, 3 pages.
(Continued)

*Primary Examiner* — Stefan Stoynov
(74) *Attorney, Agent, or Firm* — Conley Rose, P.C.

(57) ABSTRACT

A method and an apparatus for powering on a terminal. The method for powering on a terminal includes collecting, by a pressure detection sensor disposed inside a housing of a terminal, a value of pressure; sending, by the pressure detection sensor, an interrupt request to a power management unit (PMU) when the value of the pressure collected by the pressure detection sensor meets a set condition; and outputting, by the PMU, a power supply maintaining signal after receiving the interrupt request, so as to power on the terminal.

15 Claims, 2 Drawing Sheets

(56) References Cited

U.S. PATENT DOCUMENTS

| | | | | |
|---|---|---|---|---|
| 8,878,788 | B2* | 11/2014 | Zurek | G06F 1/3262 345/156 |
| 2005/0078093 | A1 | 4/2005 | Peterson, Jr. et al. | |
| 2005/0140255 | A1 | 6/2005 | Wilson | |
| 2006/0236132 | A1* | 10/2006 | Chen | G06F 1/3215 713/300 |
| 2008/0018610 | A1* | 1/2008 | Harmon | G06F 3/0416 345/173 |
| 2011/0080155 | A1* | 4/2011 | Aldridge | H02N 2/18 323/318 |
| 2014/0292699 | A1 | 10/2014 | Ando | |

FOREIGN PATENT DOCUMENTS

| | | |
|---|---|---|
| CN | 1906013 A | 1/2007 |
| CN | 101877744 A | 11/2010 |
| CN | 101894036 A | 11/2010 |
| CN | 102520627 A | 6/2012 |
| CN | 103605569 A | 2/2014 |
| EP | 2144138 A1 | 1/2010 |
| GB | 2409366 A | 6/2005 |
| WO | 9838779 A1 | 9/1998 |
| WO | 2013089048 A1 | 6/2013 |

OTHER PUBLICATIONS

Partial English Translation and Abstract of Chinese Patent Application No. CN103605569, Part 1, Apr. 21, 2016, 4 pages.
Partial English Translation and Abstract of Chinese Patent Application No. CN103605569, Part 2, Apr. 21, 2016, 2 pages.
Partial English Translation and Abstract of Chinese Patent Application No. CN101877744, Apr. 21, 2016, 11 pages.
Partial English Translation and Abstract of Chinese Patent Application No. CN101894036, Apr. 21, 2016, 10 pages.
Foreign Communication From a Counterpart Application, Chinese Application No. 201310565859.2, Chinese Office Action dated Mar. 3, 2016, 5 pages.
Foreign Communication From a Counterpart Application, Chinese Application No. 201310565859.2, Chinese Search Report dated Feb. 5, 2016, 2 pages.
Foreign Communication From a Counterpart Application, PCT Application No. PCT/CN2014/082145, English Translation of International Search Report dated Sep. 23, 2014, 2 pages.
Foreign Communication From a Counterpart Application, PCT Application No. PCT/CN2014/082145, English Translation of Written Opinion dated Sep. 23, 2014, 2 pages.
Foreign Communication From a Counterpart Application, European Application No. 14862513.0, Extended European Search Report dated Jul. 29, 2016, 8 pages.

* cited by examiner

METHOD AND APPARATUS FOR POWERING ON A TERMINAL

CROSS-REFERENCE TO RELATED APPLICATIONS

This application is a National Stage of International Application No. PCT/CN2014/082145, filed on Jul. 14, 2014, which claims priority to Chinese Patent Application No. 20131056859.2, filed on Nov. 13, 2013, both of which are hereby incorporated by reference in their entireties.

TECHNICAL FIELD

Embodiments of the present disclosure relate to the field of electronic technologies, and in particular, to a method and an apparatus for powering on a terminal.

BACKGROUND

At present, it is relatively common that a menu key, an Enter key, and the like of a terminal typically adopt a virtual key manner.

The virtual key manner is using software to detect a variation of a detection value, such as a value of pressure or a value of capacitance, in a corresponding position after key pressing, so as to determine an intention of pressing the key by a user. A precondition of the software detection is that power is supplied to a system, and therefore the existing virtual key manner applies only to the menu key, the Enter key, and the like, and cannot apply to a power-on button.

At present, the power-on button of the terminal typically adopts a physical button manner.

The physical button manner is that a metal contact under the power-on button contacts a circuit board after a user presses the power-on button, so that a current forms a loop, thereby implementing a power-on function.

In the physical button manner, a surface of the terminal needs to be holed. As a result, a gap is left between the power-on button and a housing of the terminal, which does not facilitate integrated design of a terminal device, so that waterproof and dustproof difficulties increase.

SUMMARY

In view of this, embodiments of the present disclosure provide a method and an apparatus for powering on a terminal, so as to resolve a problem that a housing of a terminal must be holed to dispose a power-on button.

According to a first aspect, a method for powering on a terminal is provided, including collecting, by a pressure detection unit disposed inside a housing of a terminal, a value of pressure generated when a user presses the housing of the terminal, and sending, by the pressure detection unit, an interrupt request to a power supply module when the value of the pressure collected by the pressure detection unit meets a set condition; and responding, by the power supply module, to the interrupt request, and outputting a power supply maintaining signal to power on the terminal.

In a first possible implementation manner of the first aspect, the set condition includes the value of the pressure is greater than or equal to the set threshold.

In a second possible implementation manner of the first aspect, before the responding, by the power supply module, to the interrupt request, and outputting a power supply maintaining signal, the power supply module further determines a size relationship between duration of the interrupt request and a preset minimum power-on time, and outputs the power supply maintaining signal when the duration of the interrupt request is greater than or equal to the preset minimum power-on time.

With reference to the second possible implementation manner of the first aspect, in a third possible implementation manner, the minimum power-on time is 500 milliseconds (ms) to 3 seconds (s).

According to a second aspect, an apparatus for powering on a terminal is provided, including a pressure detection unit, disposed inside a housing of a terminal and configured to collect a value of pressure generated when a user presses the housing of the terminal, and output an interrupt request when the value of the pressure collected by the pressure detection unit meets a set condition; and a power supply module, electrically connected to the pressure detection unit and configured to respond to the interrupt request, and output a power supply maintaining signal to power on the terminal.

In a first possible implementation manner of the second aspect, the set condition includes the value of the pressure is greater than or equal to the set threshold.

In a second possible implementation manner of the second aspect, the power supply module includes a time determining unit configured to determine a size relationship between duration of the interrupt request and a preset minimum power-on time, and output the power supply maintaining signal when the duration of the interrupt request is greater than or equal to the preset minimum power-on time.

With reference to the second possible implementation manner of the second aspect, in a third possible implementation manner, the minimum power-on time is 500 ms to 3 s.

In a fourth possible implementation manner of the second aspect, a protrusion part is disposed on the housing of the terminal, and the protrusion part is located between the housing of the terminal and the pressure detection unit and is in contact with the pressure detection unit, so as to reduce a gap between the housing of the terminal and the pressure detection unit.

With reference to the fourth possible implementation manner of the second aspect, in a fifth possible implementation manner, the protrusion part is arc-shaped.

According to the foregoing solutions, a pressure detection unit is disposed inside a housing of a terminal. A user needs only to press the housing of the terminal, and then the pressure detection unit can detect pressure and output an interrupt request to a power supply module to implement a power-on effect. The housing of the terminal does not need to be holed to dispose a power-on button, thereby improving waterproof and dustproof effects.

BRIEF DESCRIPTION OF DRAWINGS

To describe the technical solutions in the embodiments of the present disclosure more clearly, the following briefly introduces the accompanying drawings required for describing the embodiments. The accompanying drawings in the following description show merely some embodiments of the present disclosure, and persons of ordinary skill in the art may still derive other drawings from these accompanying drawings without creative efforts.

DESCRIPTION OF REFERENCE NUMERALS

1. Housing
2. Pressure detection unit
3. Power supply module
4. Protrusion part

DESCRIPTION OF EMBODIMENTS

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. The described embodiments are some but not all of the embodiments of the present disclosure. All other embodiments obtained by persons of ordinary skill in the art based on the embodiments of the present disclosure without creative efforts shall fall within the protection scope of the present disclosure.

The technical solutions in the embodiments of the present disclosure may apply to various terminals, such as a smartphone, a tablet, and a computer device, an information display device, or a communications device with a pressure detection unit. The pressure detection unit in the embodiments may be a pressure sensor.

Figure 1:
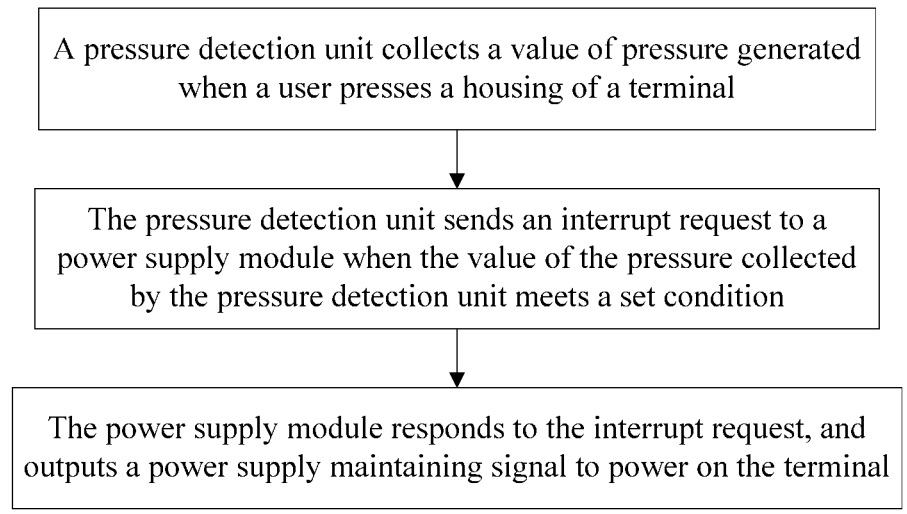
FIG. 1 is a flowchart of a method for powering on a terminal according to an embodiment of the present disclosure.

An embodiment of the present disclosure provides a method for powering on a terminal. Referring to FIG. 1, a procedure of the method is as follows.

101. A pressure detection unit disposed inside a housing of a terminal collects a value of pressure generated when a user presses the housing of the terminal.

The housing of the terminal bears the pressure generated when the user presses the housing of the terminal. The pressure detection unit is disposed under the housing of the terminal and is adjacent to or in contact with the housing of the terminal, so as to accurately collect the pressure generated when the user presses the housing of the terminal. In this way, when the pressure generated when the user presses the housing of the terminal deforms the housing of the terminal, the pressure detection unit can accurately detect force of the pressure from the user in real time. It may be understood that, for a purpose of reducing costs, the pressure detection unit does not need to be disposed under the entire housing of the terminal; instead, a specific position on the housing of the terminal may be designated as a power-on press position, and accordingly, the pressure detection unit is disposed only under the specific position on the housing of the terminal. Certainly, multiple specific positions may also be disposed on the terminal as power-on press positions, and accordingly, pressure detection units are disposed only under the multiple specific positions on the housing of the terminal.

102. The pressure detection unit sends an interrupt request to a power supply module when the value of the pressure collected by the pressure detection unit meets a set condition.

Optionally, the set condition may be the collected value of the pressure is greater than or equal to a preset threshold.

It should be noted that, on the one hand, when the pressure detection unit collects the value of the pressure, a data interface of the pressure detection unit may output information about the value of the pressure. The data interface transmits data through multiple communications buses, such as a synchronous serial communications (e.g., Serial Peripheral Interface (SPI)) bus and a full-duplex synchronous data transfer (e.g., Inter-Integrated Circuit (I2C)) bus. In a virtual key solution in the prior art, a data interface of a pressure detection unit outputs a set of data to a processor, and the processor and software invoked by the processor analyze and process the data and implement a corresponding key function (such as a menu key, an Enter key, and a play key). However, in a case in which a power supply is not started, the processor cannot analyze and process the data, and therefore a power-on effect cannot be achieved according to the existing virtual key method. On the other hand, the pressure detection unit may output the interrupt request when the collected value of the pressure meets the set condition (for example, the value of the pressure is greater than or equal to the threshold). The output of the interrupt request requires only one interrupt request line, the interrupt request line may be directly connected to a corresponding interface of the power supply module, the interrupt request may trigger the power supply module, and an effect of the triggering is exactly the same as an effect of a physical on/off button. Therefore, in a power-off state, the pressure detection unit may be allowed to monitor a variation of a value of external pressure in real time, provided that a quite small amount of electricity is supplied to the pressure detection unit so that the pressure detection unit is always in an operating state. When collecting a value of pressure greater than or equal to the threshold, the pressure detection unit outputs the interrupt request to the power supply module as a signal for triggering the power supply module.

103. The power supply module responds to the interrupt request, and outputs a power supply maintaining signal to power on the terminal.

The power supply module may be an integrated power management unit (PMU), or may be a combination (for example, a combination of a direct current-direct current (DC-DC) convertor, a linear regulator, an overvoltage protection circuit, and the like) of discrete power management components and the like.

It should be noted that a function of the interrupt request is triggering the power supply module, and after the power supply module is triggered, the power supply module has a self-memory function, that is, the power supply module is capable of continues outputting the power supply maintaining signal after the interrupt request disappears.

It should be noted that after the power supply module is triggered, a power supply may be converted into multiple different power supply maintaining signals by using an internal circuit such as a DC-DC conversion circuit, so as to provide different multi-level power supplies required by a master chip and one or more other parts (such as a radio frequency device and a camera module), so that all these units can work properly.

Figure 2:
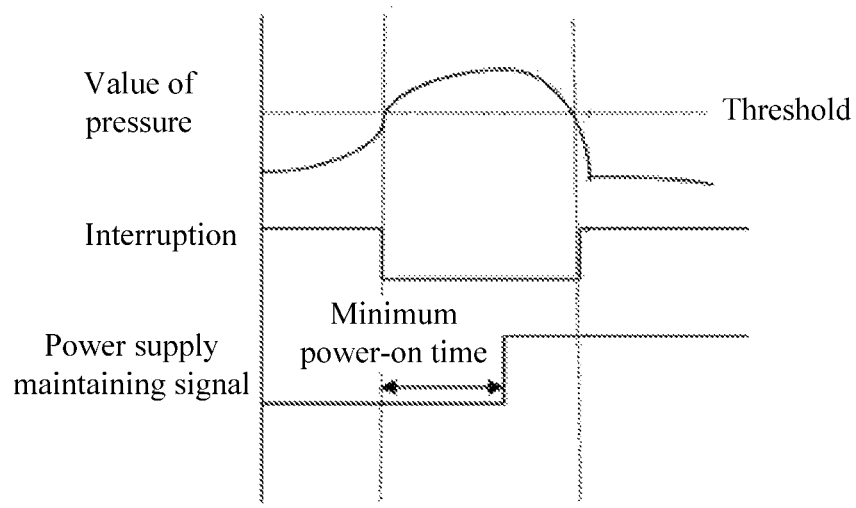
FIG. 2 is a schematic waveform diagram of a power-on process according to an embodiment of the present disclosure.

A further preferred step of step 103 is recording, by the power supply module, duration of the interrupt request after receiving the interrupt request, and outputting the power supply maintaining signal when the duration is greater than or equal to a preset minimum power-on time (refer to FIG. 2).

Optionally, the minimum power-on time is 500 ms to 3 s.

False triggering may be generated because the pressure detection unit cannot recognize a source and a purpose of the external pressure. In this case, the false triggering may be relatively reduced by recording the duration of the interrupt request, comparing the duration of the interrupt request with the preset minimum power-on time, and starting the power supply only in a case in which the duration of the interrupt request is greater than or equal to the minimum power-on time. The optional minimum power-on time provided in this embodiment of the present disclosure is 500 ms to 3 s, considering that the minimum power-on time should not be set to a long time, and an effect of user experience is definitely affected if the terminal is not powered on after long-time pressing.

In this embodiment of the present disclosure, a pressure detection unit is disposed inside a housing of a terminal. A user needs only to press the housing of the terminal, and then the pressure detection unit can detect pressure and output an interrupt request to a power supply module to implement a power-on effect. The housing of the terminal does not need to be holed to dispose a power-on button, thereby improving waterproof and dustproof effects.

Figure 3:
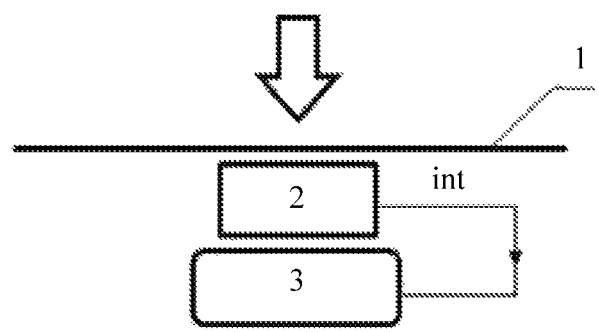
FIG. 3 is a schematic structural diagram of an apparatus for powering on a terminal according to an embodiment of the present disclosure.

Another embodiment of the present disclosure provides an apparatus for powering on a terminal. FIG. 3 is a schematic structural diagram of an apparatus for powering on a terminal according to an embodiment of the present disclosure. The apparatus for powering on a terminal includes a pressure detection unit 2, disposed inside a housing 1 of a terminal and configured to collect a value of pressure (pressure indicated by an arrow in the figure) generated when a user presses the housing 1 of the terminal, and output an interrupt request ("int" in the figure is short for interruption, indicating the interrupt request) when the value of the pressure collected by the pressure detection unit 2 meets a set condition; and a power supply module 3, electrically connected to the pressure detection unit 2 and configured to respond to the interrupt request, and output a power supply maintaining signal to power on the terminal.

A manner of the electrical connection not only includes a manner of direct physical contact or electrical contact between different modules or units, but also includes cooperation or interaction between different modules or units without the direct physical contact or the electrical contact.

Optionally, the set condition may be the collected value of the pressure is greater than or equal to a preset threshold.

In this embodiment of the present disclosure, the pressure detection unit 2 is disposed under the housing 1 of the terminal and is adjacent to or contacts the housing 1 of the terminal, so as to accurately collect the pressure generated when the user presses the housing of the terminal. In this way, when the pressure generated when the user presses the housing 1 of the terminal deforms the housing 1 of the terminal, the pressure detection unit 2 can accurately detect force of the pressure from the user in real time. It may be understood that, for a purpose of reducing costs, the pressure detection unit 2 does not need to be disposed under the entire housing 1 of the terminal, a specific position on the housing 1 of the terminal may be designated as a power-on press position, and accordingly, the pressure detection unit 2 is disposed only under the specific position on the housing 1 of the terminal. Certainly, multiple specific positions may also be disposed on the housing 1 of the terminal as power-on press positions, and accordingly, pressure detection units 2 are disposed only under the multiple specific positions on the housing 1 of the terminal.

In this embodiment of the present disclosure, on the one hand, when the pressure detection unit 2 collects the value of the pressure, a data interface of the pressure detection unit 2 may output information about the value of the pressure. These data interfaces typically transmit data through multiple communications buses (such as an SPI bus and an I2C bus) for output. In a virtual key solution in the prior art, a data interface of a pressure detection unit 2 outputs a set of data to a processor, and software in the processor analyzes and processes the data and implements a corresponding key function (such as a menu key, an Enter key, and a play key). However, in a case in which a power supply is not started, the processor cannot analyze and process the data, and therefore a power-on effect cannot be achieved according to the existing virtual key method. On the other hand, the pressure detection unit 2 may output the interrupt request when the value of the pressure is greater than or equal to the threshold. The output of the interrupt request requires only one interrupt request line (a solid line with an arrow in FIG. 3 or FIG. 4), the interrupt request line may be directly connected to a corresponding interface of the power supply module 3, the power supply module 3 is triggered, and an effect of the triggering is exactly the same as an effect of a physical on/off button. The power supply module 3 may be an integrated PMU, or may be a combination (for example, a combination of a DC-DC convertor, a linear regulator, an overvoltage protection circuit, and the like) of discrete power management components and the like. A main function of the power supply module 3 is responding to the interrupt request and outputting the power supply maintaining signal, and the power supply module may further provide different-voltage multi-level power supplies required by a master chip and one or more other parts (such as a radio frequency device and a camera module), so that these units can work properly.

In the embodiment, a pressure detection unit is disposed inside a housing 1 of a terminal. A user needs only to press the housing 1 of the terminal, and then the pressure detection unit 2 can detect pressure and output an interrupt request to a power supply module 3 to implement a power-on effect. The housing of the terminal does not need to be holed to dispose a power-on button, thereby improving waterproof and dustproof effects.

Figure 4:
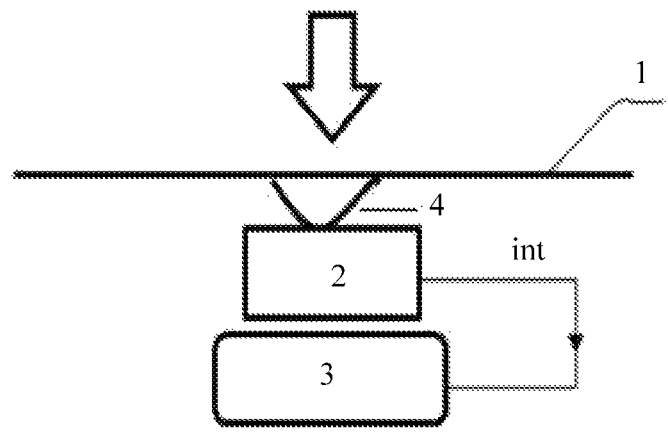
FIG. 4 is a schematic structural diagram of another apparatus for powering on a terminal according to an embodiment of the present disclosure.

Still another embodiment of the present disclosure provides another apparatus for powering on a terminal. FIG. 4 is a schematic structural diagram of another apparatus for powering on a terminal according to an embodiment of the present disclosure. The apparatus includes a pressure detection unit 2, disposed inside a housing 1 of a terminal and configured to collect a value of pressure (pressure indicated by an arrow in the figure) generated when a user presses the housing 1 of the terminal, and output an interrupt request when the value of the pressure collected by the pressure detection unit 2 meets a set condition; a power supply module 3, electrically connected to the pressure detection unit 2 and configured to respond to the interrupt request, and output a power supply maintaining signal to power on the terminal; and a protrusion part 4, where the protrusion part disposed on the housing of the terminal is located between the housing 1 of the terminal and the pressure detection unit 2 and is in contact with the pressure detection unit 2, so that the pressure detection unit 2 more effectively detects pressure generated when the housing 1 of the terminal deforms.

A difference from the embodiment provided in FIG. 3 lies in that the protrusion part 4 exists between the pressure detection unit 2 and the housing 1 of the terminal. A gap may exist between the housing 1 of the terminal and the pressure detection unit 2; therefore, adding a protrusion part 4 may alleviate a problem that the pressure detection unit 2 cannot detect pressure on the housing 1 of the terminal because a gap between the pressure detection unit 2 and the housing 1 of the terminal is too wide due to reasons such as thermal expansions and contractions.

Optionally, the protrusion part 4 is arc-shaped.

In this embodiment of the present disclosure, a pressure detection unit is disposed inside a housing of a terminal. A user needs only to press the housing of the terminal, and then the pressure detection unit can detect pressure and output an interrupt request to a power supply module to implement a power-on effect. In addition, a protrusion part is disposed on the housing of the terminal, which may alleviate a problem that the pressure detection unit cannot detect pressure on the housing of the terminal because a gap between the pressure detection unit and the housing of the terminal is too wide due to reasons such as thermal expansions and contractions.

Finally, it should be noted that the above embodiments are merely intended for describing the technical solutions of the present disclosure other than limiting the present disclosure. Although the present disclosure is described in detail with reference to the foregoing embodiments, persons of ordinary skill in the art should understand that they may still make modifications to the technical solutions described in the foregoing embodiments or make equivalent substitutions to some technical features thereof, without departing from the spirit and scope of the technical solutions of the embodiments of the present disclosure.

What is claimed is:

1. A method for powering on a terminal, comprising:
    generating, by a pressure detection sensor of the terminal, a pressure value when a force is applied to the terminal;
    sending, by the pressure detection sensor, to a power management device an interrupt request signal at a first time when the pressure value meets or exceeds a set condition;
    continue sending, by the pressure detection sensor to the power management device, the interrupt request signal while the pressure value meets or exceeds the set condition;
    waiting, by the power management device, a predetermined time during which the interrupt request signal is active until a second time; and
    outputting, by the power management device, a power supply maintaining signal for supplying power to the terminal.

2. The method according to claim 1, wherein the set condition comprises a preset pressure threshold value.

3. The method according to claim 1, wherein the second time is equal to a preset minimum power-on time.

4. The method according to claim 3, wherein the preset minimum power-on time is in a range of 500 milliseconds to 3 seconds.

5. An apparatus for powering on a terminal, comprising:
    a housing;
    a pressure detection sensor coupled to the housing, wherein the pressure detection sensor is configured to:
        generate a pressure value when a force is applied to the housing;
        send an interrupt request signal at a first time when the pressure value meets or exceeds a set condition; and
        continue to send the interrupt request signal while the pressure value meets or exceeds the set condition; and
    a power management component electrically connected to the pressure detection sensor, wherein the power management component is configured to:
        wait a predetermined time during which the interrupt request signal is active until a second time; and
        output a power supply maintaining signal for supplying power to the terminal.

6. The apparatus for powering on a terminal according to claim 5, wherein the set condition comprises a preset threshold pressure value.

7. The apparatus for powering on a terminal according to claim 6, wherein the second time is equal to a preset minimum power-on time.

8. The apparatus for powering on a terminal according to claim 7, wherein the preset minimum power-on time is in a range of 500 milliseconds to 3 seconds.

9. The apparatus for powering on a terminal according to claim 5, further comprising a protrusion part disposed on the housing, wherein the protrusion part is located between the housing and the pressure detection sensor, and wherein the protrusion part is in contact with the pressure detection sensor.

10. The apparatus for powering on a terminal according to claim 9, wherein the protrusion part is arc-shaped.

11. The apparatus for powering on a terminal according to claim 5, wherein the pressure detection sensor generates the pressure value while the terminal is powered-off.

12. A terminal, comprising:
    a power management component; and
    a pressure detection sensor coupled to the power management component and configured to:
        generate a pressure value when a force is applied to the terminal;
        send to the power management component an interrupt request signal at a first time when the pressure value exceeds a predetermined pressure threshold value; and
        continue to send to the power management component the interrupt request signal for a duration while the pressure value meets or exceeds the predetermined pressure threshold value, wherein the power management component is configured to output a power supply maintaining signal when the duration is at least equal to a preset minimum power-on time.

13. The terminal according to claim 12, wherein the preset minimum power-on time is 500 milliseconds to 3 seconds.

14. The terminal according to claim 12, wherein the power management component is further configured to compare the duration with the preset minimum power-on time.

15. The terminal according to claim 12, wherein the pressure detection sensor generates the pressure value while the terminal is powered-off.

* * * * *